United States Patent
Lin et al.

(10) Patent No.: US 7,563,106 B2
(45) Date of Patent: Jul. 21, 2009

(54) CPU SOCKET CONFIGURED WITH ASSEMBLED GRIDS

(75) Inventors: Nan-Hong Lin, Tu-Cheng (TW); Chih-Pi Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/895,859

(22) Filed: Aug. 28, 2007

(65) Prior Publication Data

US 2008/0050983 A1 Feb. 28, 2008

(30) Foreign Application Priority Data

Aug. 28, 2006 (TW) .............................. 95131514 A

(51) Int. Cl.
*H01R 12/00* (2006.01)
(52) U.S. Cl. ......................................... 439/70; 439/608
(58) Field of Classification Search ................... 439/70, 439/71, 608
See application file for complete search history.

(56) References Cited

U.S. PATENT DOCUMENTS

| 3,246,208 | A | * | 4/1966 | Ross et al. ................... 361/805 |
| 3,406,369 | A | * | 10/1968 | Taylor, Jr. .................... 439/49 |
| 3,418,621 | A | * | 12/1968 | Campbell, Jr. ............... 439/51 |
| 3,587,028 | A | * | 6/1971 | Uberbacher .................. 439/49 |
| 4,611,867 | A | * | 9/1986 | Ichimura et al. ............ 439/101 |
| 5,201,855 | A | * | 4/1993 | Ikola .......................... 439/608 |
| 6,971,916 | B2 | * | 12/2005 | Tokunaga ................... 439/608 |

* cited by examiner

*Primary Examiner*—Thanh-Tam T Le
(74) *Attorney, Agent, or Firm*—Wei Te Chung

(57) ABSTRACT

Provided herewith is a CPU socket made of composite configuration of passageways. The Socket includes an insulative housing defining an opening therein. A grid is securely assembled in the opening defining a plurality of passageways for securely receiving a contact terminal therein. The grid includes a plurality of latitudinal partitions, and a plurality of longitudinal partitions orthogonally intersected from each other so as to define the passageway across the opening.

9 Claims, 5 Drawing Sheets

X

Y

CPU SOCKET CONFIGURED WITH ASSEMBLED GRIDS

FIELD OF THE INVENTION

The present invention relates to a CPU socket, and more particularly, to a CPU socket configured by assembled grids so as to define a plurality of passageways across a supporting area of a housing of the socket.

DESCRIPTION OF THE PRIOR ART

U.S. Pat. No. 7,001,197 issued to Shirai on Feb. 21, 2006 discloses a typical type of LGA socket. As clearly shown in Figures, the socket generally includes a metal stiffener with a housing securely supported therein. Then a metal clip is pivotally assembled to the stiffener. On the other hand, a clip is pivotally assembled to the other side of the stiffener and when the clip is closed to the stiffener, the lever having a cam can lock the clip to a closed position. The housing is basically injection-molded by plastic material.

U.S. Pat. No. 6,877,990 issued to Liao et al on Apr. 12, 2005 discloses another typical type of LGA socket in which the pickup cap is attached to the cover member, as shown in FIG. 1 and others along with its description. Other U.S. Pat. Nos. 7,080,986 7,090,517, and 7,059,863 disclose similar pickup of the like. Again, the housing is also injection-molded by plastic material U.S. Pat. No. 6,916,195 issued to Byquist on Jun. 12, 2005 discloses another type of land grid array device, and U.S. Pat. No. 6,164,980 issued to Goodwin on Dec. 26, 2000 discloses another type of land grid array socket, which is slightly different from the land grid array apparatuses disclosed above.

All housings of the above-mentioned patent are plastic-injection-molded. Injection-molded is a cost-economic way to make the housing with a certain contact pitch, i.e. more than 1.00 minimeter. Since the CPU become more and more powerful, while its dimension becomes smaller and smaller, the CPU socket has to reduce its dimension so as to accommodate the CPU package. One of the problems associated with the injection-molded housing is molten-plastic flow within the mold cavity. When the dimension of the housing reduces, the thickness of the partitions across the housing to define the passageways is also reduced. Currently, the thickness is about 0.3 minimeter, and it would be almost impossible to extend beyond this limitation in view of productivity as well as yield.

SUMMARY OF THE INVENTION

It is therefore an object of the present invention to provide a CPU socket with composite configuration such that a pitch between two adjacent contact terminals can break through the current limitation, and reach to a new boundary.

In order to achieve to the object set forth, a CPU socket made of in accordance with the present invention includes an insulative housing defining an opening therein. A grid is securely assembled in the opening defining a plurality of passageways for securely receiving a contact terminal therein. The grid includes a plurality of latitudinal partitions, and a plurality of longitudinal partitions orthogonally intersected from each other so as to define the passageway across the opening.

According to one aspect of the present invention, the grid is configured by a plurality of latitudinal and longitudinal partitions orthogonal intersected from each other. Each of the latitudinal partitions is configured with a base strip, a contact terminal defining strip, and a finish strip jointly sandwiched from one another. Each of the longitudinal is also defined with a plurality of assembling slits opened downward respecting to the assembling slits of the base strip, the contact terminal defining strip, and finish strip. Thereby by interengaging of the longitudinal strip with the base strip, the contact terminal defining strip, and finish strip, the plurality of passageways is well defined and configured.

DESCRIPTION OF PREFERRED EMBODIMENT OF THE INVENTION

Reference will now be made to the drawings to describe the present invention in detail.

Figure 1:
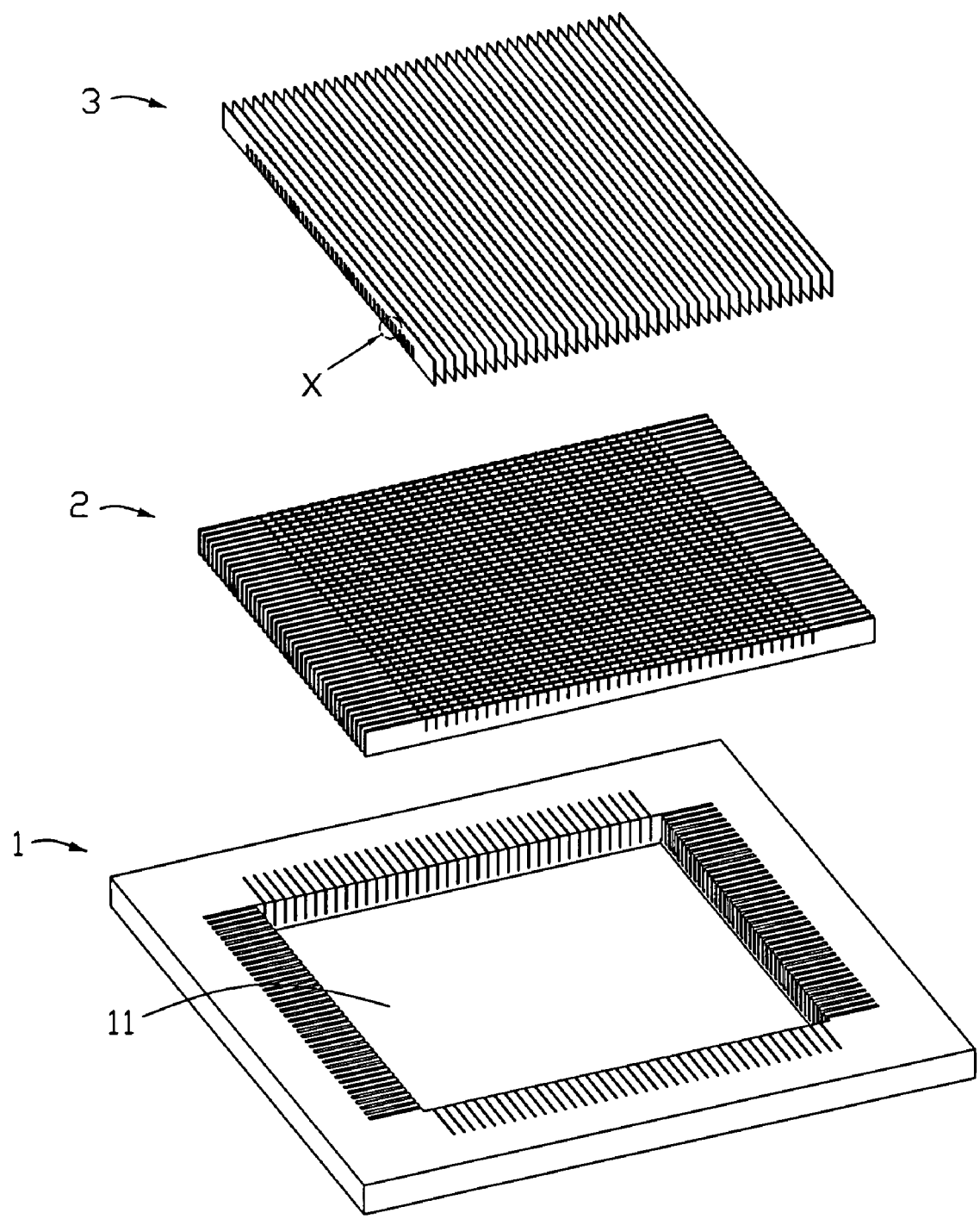
FIG. 1 is an exploded, isometric view of an CPU socket in accordance with a preferred embodiment of the present invention.

Reference is now made to FIG. 1, the CPU socket in accordance with a preferred embodiment of the present invention, comprising an insulative housing 1, and a grid.

Reference is also made to FIG. 1, the insulative housing 1 defining an opening 11 in the middle thereof, said grid securely assembled in the opening defining a plurality of passageways 4 for securely receiving a contact terminal (not shown) therein. The grid includes a plurality of latitudinal partitions 2, and a plurality of longitudinal partitions 3 orthogonally intersected from each other so as to define said passageway 4 across the opening 11. Edges of the opening 11 include a plurality of slits (as shown in FIG. 1, but not labeled) for securely receiving ends of the latitudinal and longitudinal partitions therein. As description of foregoing, the grid defines a supporting surface (not labeled), which is substantially flush to a top surface of the insulative housing 1. It is noted that, in a preferred embodiment of the present invention, each of the latitudinal partitions 2 is detachable from the insulative housing 1, and likewise for each of the longitudinal partitions 3; and in a varying preferred embodiment in accordance with the present invention, each of the latitudinal partitions 2 is detachable from the insulative housing, each of the longitudinal partitions 3 is integral formed with the insulative housing 1; also it is may be each of the longitudinal partitions 3 is detachable from the insulative housing and each of the latitudinal partitions 3 is integral formed with the insulative housing.

Figure 2:
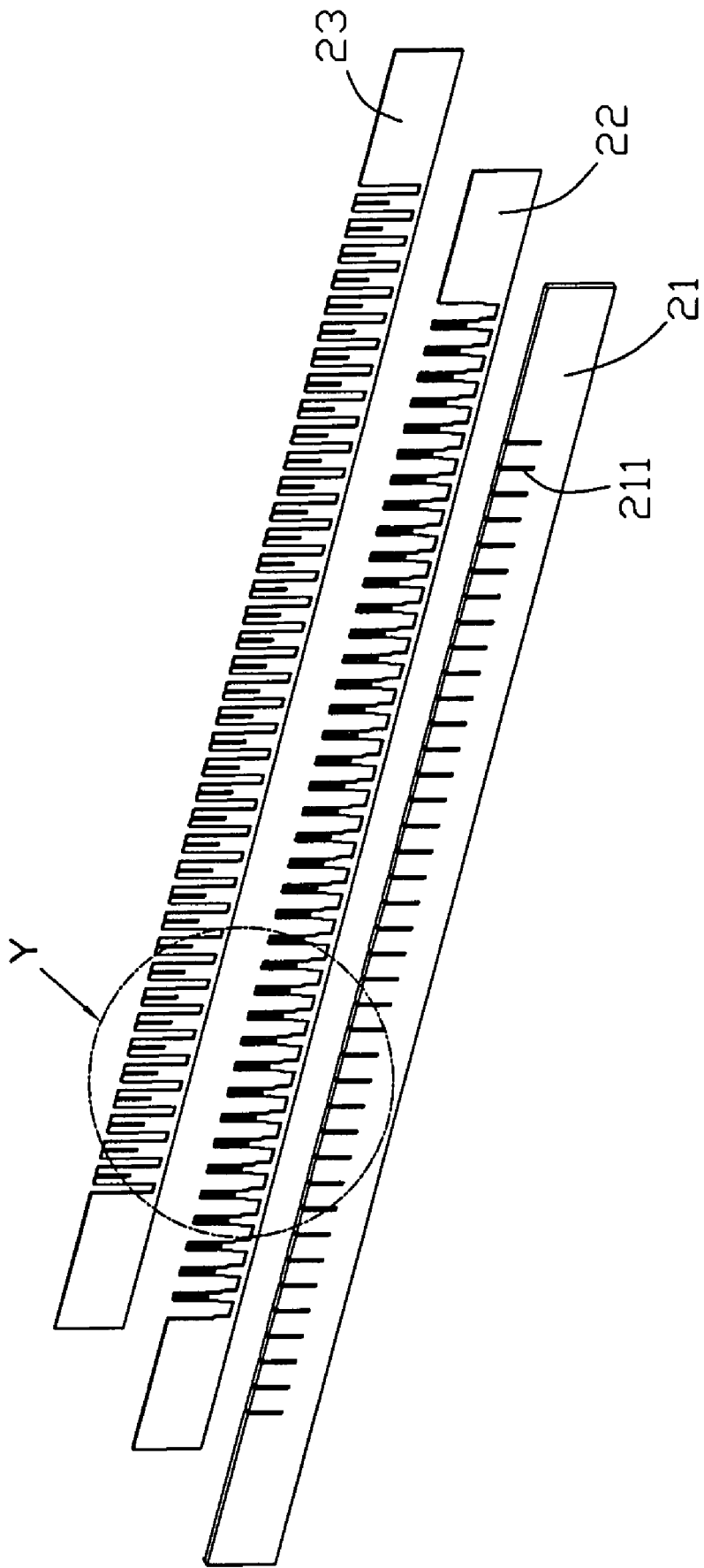
FIG. 2 is an exploded view of a longitudinal partition of FIG. 1.
Figure 3:
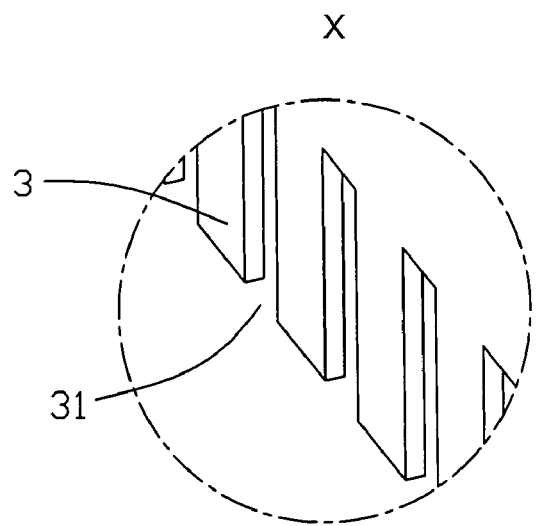
FIG. 3 is an enlarged view of the circled portion X of FIG. 1.
Figure 4:
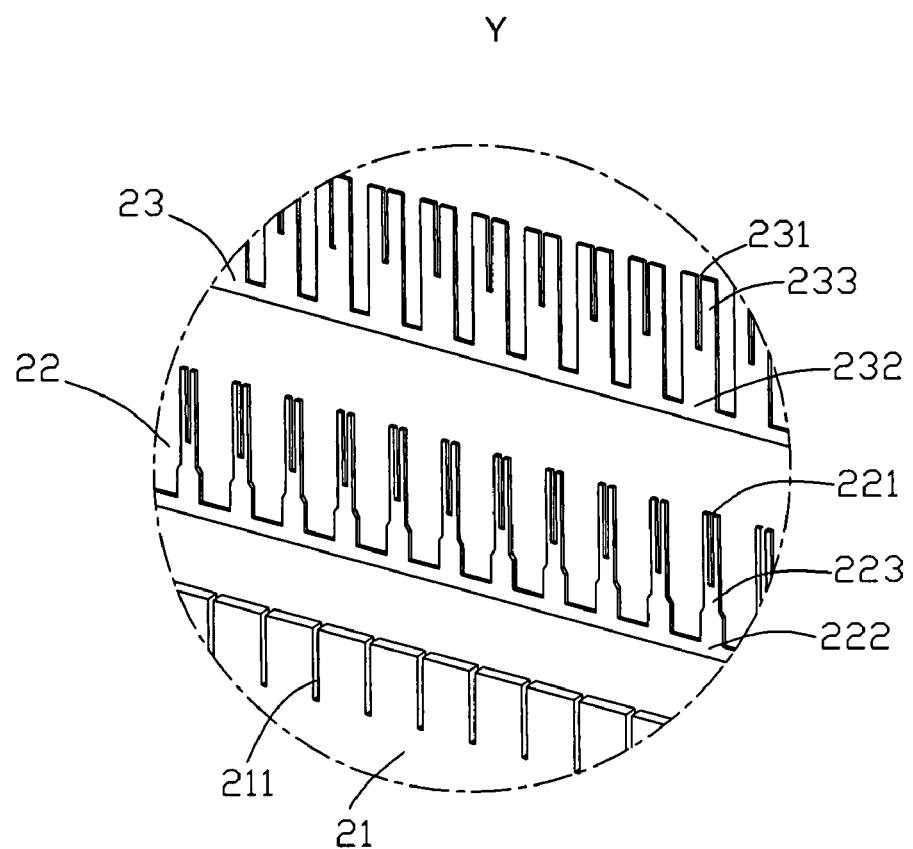
FIG. 4 is an enlarged view of the circled portion Y of FIG. 2.

Referring to FIGS. 2-4, a latitudinal partition 2 and a enlarged portion of a longitudinal partition 3 in accordance with a preferred embodiment is shown. The latitudinal partition 2 is configured with a base strip 21, a contact terminal defining strip 23, and a finish strip 22 jointly sandwiched from one another. Each of the base strip 21, the contact terminal defining strip 23, and finish strip 22 is defined with a plurality of assembling slits opened upward and proper aligned with each other.

Referring to FIGS. 3-4, the base strip 21 forms a plurality of first slits 211; and the finish strip 22 includes a body 222 having a plurality of extending portions 223 extending from one side thereof spaced to each other. Each of the extending portions 223 is defined with a second slit 221 respecting to a first slit 211. The contact terminal defining strip 23 is configured with a main portion 232 having a plurality of stretching portions 233 extending therefrom space to each other. Each of stretching portions 233 is defined with a third slit 231 with respect to the a first and second slit. Referring is now made to FIG. 3, each of the longitudinal partition 3 is also defined with a plurality of assembling slits 31 opened downward respecting to the assembling slits of the base strip 21, the contact terminal defining strip 23, and finish strip 22, thereby by interengaging of the longitudinal strip 3 with the base strip 21, the contact terminal defining strip 23, and finish strip 22, the plurality of passageways 4 are well defined and configured.

Figure 5:
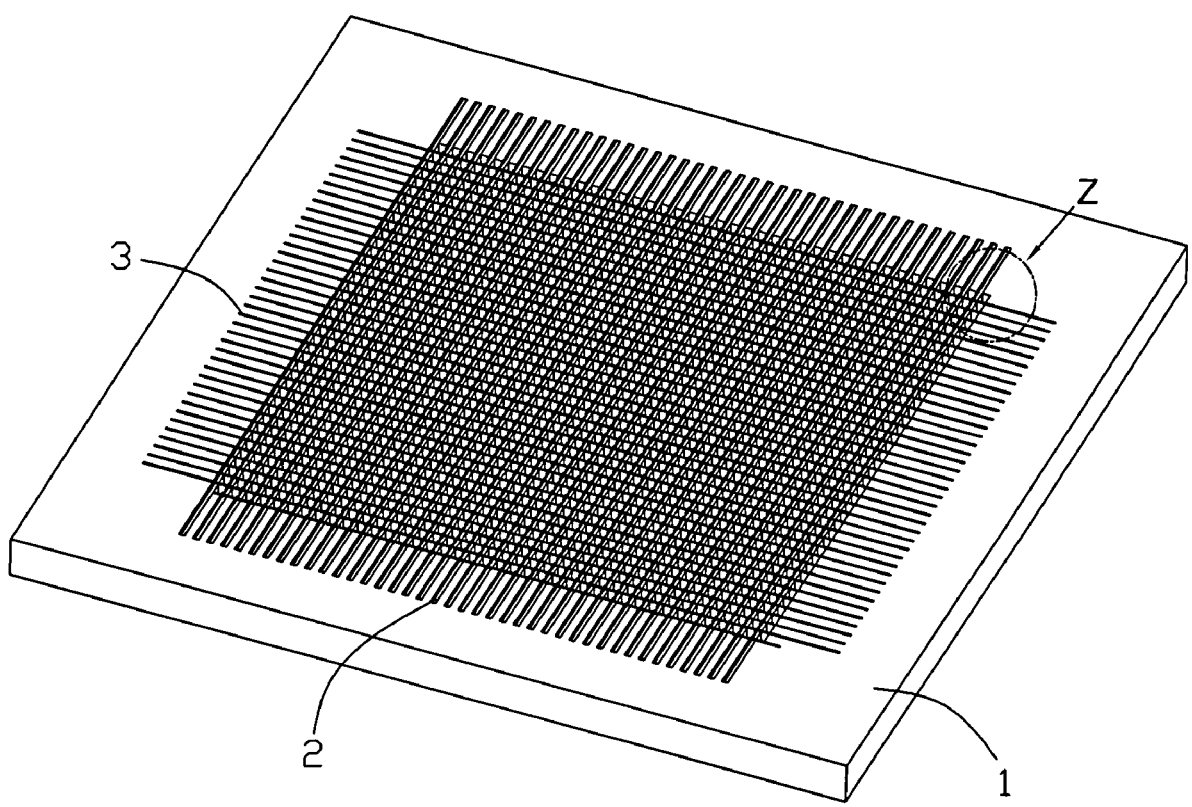
FIG. 5 is an assembled view of a CPU socket in accordance with a preferred embodiment of the present invention.
Figure 6:
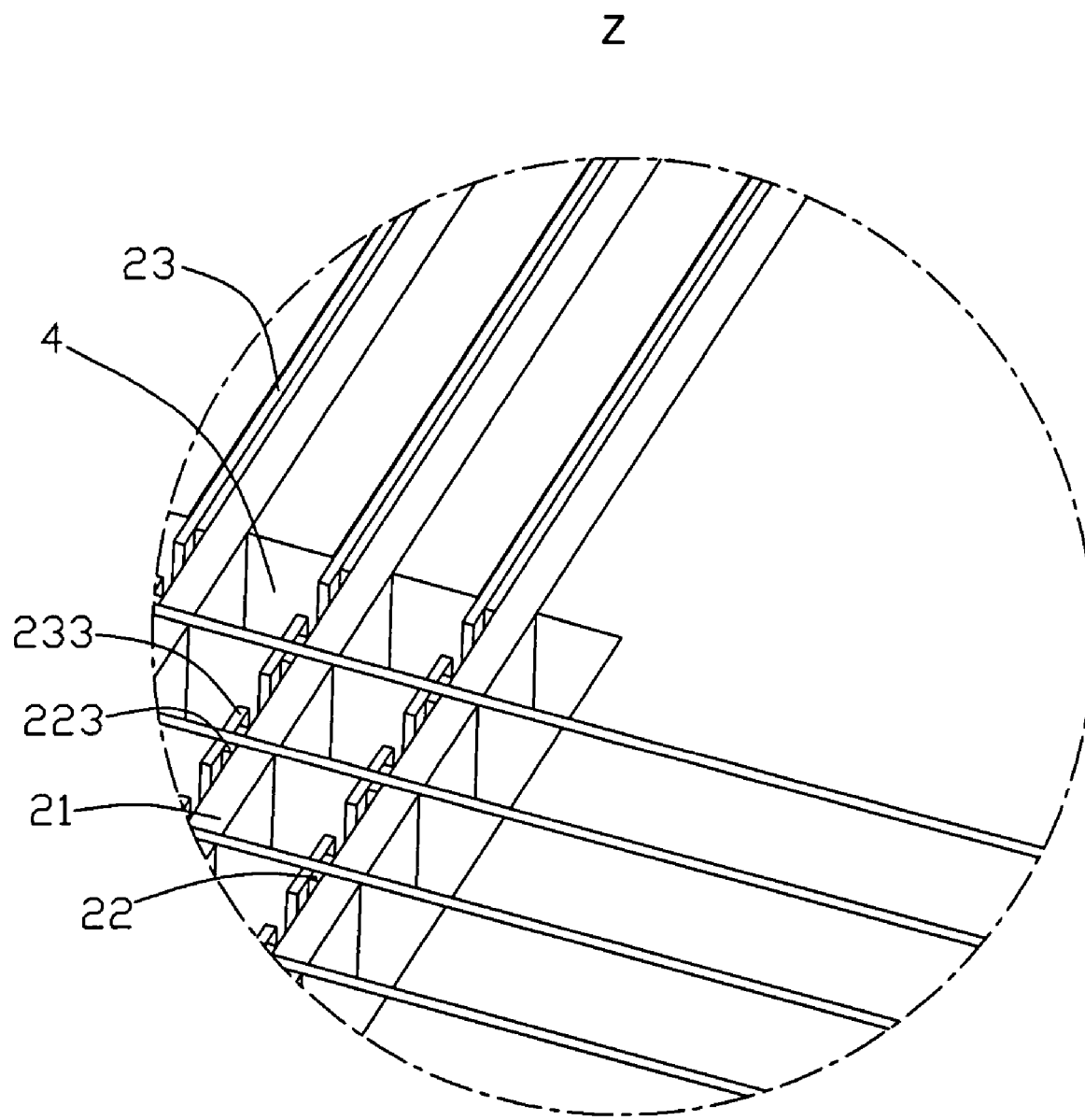
FIG. 6 is an enlarged view of the circled portion Z of FIG. 5.

FIG. 5 depicts an assembled view in accordance with a CPU socket of the present invention and FIG. 6 depicts a detail view of a passageway as well defined by the latitudinal partitions 2 and the longitudinal partitions 3. Width of the extending portion 223 of the finish strip 22 is wider than that of the stretching portion 233 of the contact terminal defining strip 23, thereby in an assembly process, when the finish strip 22 is sandwiched by the base strip 21 and the contact terminal defining strip 23, said wider portion forms a retention portion for securely the contact terminal receiving therein.

Each of the latitudinal partitions 2 and the longitudinal partitions 3 is formed from a special film material. The film has a very small thickness so as to ensure small pith between adjacent passageways. In an assembly process, the members of each latitudinal partition 2 are assembled by adhered to each other or other ways. Thus, a CPU socket with composite configuration such that a pitch between two adjacent contact terminals can break through the current limitation, and reach to a new boundary is provided.

Although the present invention has been described with reference to a certain embodiments, it is not to be constructed with limited thereto and it will be understood by those skilled in the art that various changes may be made and equivalents may be substituted without in any way departing from the scope or spirit of the present invention. In additional, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

We claim:

1. A CPU socket, comprising:
   an insulative housing defining an opening therein;
   a grid securely assembled in the opening defining a plurality of passageways for securely receiving a contact terminal therein; and
   the grid including a plurality of latitudinal partitions, and a plurality of longitudinal partitions orthogonally intersected from each other so as to define the passageway across the opening;
   wherein each of the latitudinal partitions is configured with a base strip, a contact terminal defining strip, and a finish strip jointly sandwiched from one another;
   wherein each of the base strip, the contact terminal defining strip, and finish strip is defined with a plurality of assembling slits opened upward and properly aligned with each other; and
   wherein the finish strip includes a body having a plurality of extending portions extending from one side thereof spaced to each other, and each of the extending portions is defined with a second slit respecting to a first slit defined by the base strip;
   wherein each of the contact terminal defining strip is configured with a main portion having a plurality of stretching portions extending therefrom space to each other, each of the stretching portions being defined with a third slit with respect to the first and the second slit; and
   wherein width of each of the extending portion of the finish strip is wider than that of each stretching portion of the contact terminal defining strip.

2. The CPU socket as recited in claim 1, wherein edges of the opening includes a plurality of slits securely receiving ends of the latitudinal and longitudinal partitions therein.

3. The CPU socket as recited in claim 1, wherein the grid defines a supporting surface, which is substantially flush to a top surface of the insulative housing.

4. The CPU socket as recited in claim 1, wherein each of the longitudinal is also defined with a plurality of assembling slits opened downward respecting to the assembling slits of the base strip, the contact terminal defining strip, and finish Strip, thereby by interengaging of the longitudinal strip with the base strip, the contact terminal defining strip, and finish strip, the plurality of passageways are well defined and configured.

5. A CPU socket, comprising:
   an insulative housing defining an opening therein;
   a grid securely assembled in the opening defining a plurality of passageways for securely receiving a contact terminal therein; and
   the grid including a plurality of latitudinal partitions, arid a plurality of longitudinal partitions orthogonally intersected from each other so as to define the passageway across the opening;
   wherein at least of species of the partitions is detachable from the insulative housing;
   wherein each of the latitudinal partitions is configured with a base strip, a contact terminal defining strip, and a finish strip jointly sandwiched from one another;
   wherein each of the base strip, the contact terminal defining strip, and finish strip is defined with a plurality of assembling slits opened upward and properly aligned with each other; and
   wherein each of the longitudinal partitions is also defined a plurality of assembling slits opened downward respecting to the assembling slits of the base strip, the contact terminal defining strip, and the finish strip, thereby by interengaging of the longitudinal partitions with the base strip, the contact terminal defining strip, and the finish strip, the plurality of passageways are well defined and configured.

6. The CPU socket as recited in claim 5, wherein both the latitudinal partitions and the longitudinal are detachable from the insulative housing.

7. The CPU socket as recited in claim 5, wherein one kind of the latitudinal partition and the longitudinal partition is detachable from the insulative housing, and the other kind is integral formed with the insulative housing.

8. The CPU socket as recited in claim 5, wherein edges of the opening includes a plurality of slits securely receiving ends of the latitudinal and longitudinal partitions therein.

9. The CPU socket as recited in claim 5, wherein the grid defines a supporting surface, which is substantially flush to a top surface of the insulative housing.

* * * * *